United States Patent
Jin et al.

(10) Patent No.: US 12,361,999 B2
(45) Date of Patent: Jul. 15, 2025

(54) AUXILIARY POWER SUPPLY, OPERATING METHOD OF THE AUXILIARY POWER SUPPLY AND STORAGE DEVICE INCLUDING THE AUXILIARY POWER SUPPLY

(71) Applicant: SK hynix Inc., Gyeonggi-do (KR)

(72) Inventors: Su Il Jin, Gyeonggi-do (KR); Tae Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 219 days.

(21) Appl. No.: 18/084,547

(22) Filed: Dec. 20, 2022

(65) Prior Publication Data

US 2024/0046973 A1 Feb. 8, 2024

(30) Foreign Application Priority Data

Aug. 5, 2022 (KR) .......................... 10-2022-0097934

(51) Int. Cl.
*G11C 11/4099* (2006.01)
*G11C 11/4074* (2006.01)
*G11C 11/4076* (2006.01)

(52) U.S. Cl.
CPC ...... *G11C 11/4074* (2013.01); *G11C 11/4076* (2013.01); *G11C 11/4099* (2013.01)

(58) Field of Classification Search
CPC ............ G11C 11/4074; G11C 11/4076; G11C 11/4099
USPC ........................................................ 365/226
See application file for complete search history.

(56) References Cited

U.S. PATENT DOCUMENTS

| | | | |
|---|---|---|---|
| 9,626,259 B2 * | 4/2017 | Yong | ................... G06F 11/2015 |
| 9,847,662 B2 | 12/2017 | Delpapa et al. | |
| 2012/0200264 A1 * | 8/2012 | Choi | ......................... H02J 3/32 |
| | | | 320/132 |
| 2019/0131871 A1 * | 5/2019 | Krabbenborg | ............ G05F 1/10 |
| 2021/0056023 A1 * | 2/2021 | Jin | ........................ G06F 3/0679 |

FOREIGN PATENT DOCUMENTS

| | | |
|---|---|---|
| KR | 10-2010-0116940 A | 11/2010 |
| KR | 10-2017-0028096 A | 3/2017 |
| KR | 10-2021-0007456 A | 1/2021 |

\* cited by examiner

*Primary Examiner* — Alexander Sofocleous
*Assistant Examiner* — Tracy Hampton
(74) *Attorney, Agent, or Firm* — IP & T GROUP LLP

(57) ABSTRACT

An auxiliary power supply includes an auxiliary power storage configured to store power that is input to the auxiliary power supply and a control circuit, wherein the control circuit is configured to charge, for a reference time amount after the power is input to the auxiliary power supply, the auxiliary power storage by a first current source having a preset peak current level, determine, after the reference tune amount, that the auxiliary power supply is in a slow charging state when a voltage level that is charged to the auxiliary power storage by the first current source for the reference time amount is lower than a reference voltage level, and increase, in response to the slow charging state, the peak current level to charge the auxiliary power storage by a second current source having the increased peak current level that is greater than the preset peak current level.

19 Claims, 10 Drawing Sheets

AUXILIARY POWER SUPPLY, OPERATING METHOD OF THE AUXILIARY POWER SUPPLY AND STORAGE DEVICE INCLUDING THE AUXILIARY POWER SUPPLY

CROSS-REFERENCE TO RELATED APPLICATION

The present application claims priority under 35 U.S.C. § 119(a) to Korean patent application number 10-2022-0097934, filed on Aug. 5, 2022, and which is incorporated herein by reference in its entirety.

BACKGROUND

Field of Invention

Various embodiments of the present disclosure generally relate to an electronic device, and more particularly, to an auxiliary power supply and a storage device including the auxiliary power supply.

Description of Related Art

A storage device may store data in response to control of a host device such as a computer or a smartphone. The storage device may include a memory device storing data and a memory controller controlling the memory device. Generally, there are two types of memory devices: volatile memory devices and nonvolatile memory devices.

The volatile memory devices may store data only when power is supplied thereto, and may lose data stored therein when power is not supplied. Examples of the volatile memory devices include a Static Random Access Memory (SRAM) device, a Dynamic Random Access Memory (DRAM) device, and the like.

The nonvolatile memory devices may retain stored data even when supply of power interrupted or blocked. Examples of the nonvolatile memory devices include a Read Only Memory (ROM) device, a Programmable ROM (PROM) device, an Electrically Programmable ROM (EPROM) device, an Electrically Erasable and Programmable ROM (EEPROM) device, a flash memory device, and the like.

When power is not supplied to the storage device, data stored in the volatile memory devices and data stored in the nonvolatile memory devices may be damaged. The storage device may use an auxiliary power supply in case supply of power is abruptly stopped.

SUMMARY

Various embodiments of the present disclosure are directed to an auxiliary power supply that supports an improved charging method, and a method of operating the auxiliary power supply.

According to an embodiment of the present disclosure, an auxiliary power supply may include an auxiliary power storage configured to store power that is input to the auxiliary power supply and a control circuit. The control circuit may be configured to charge, for a reference time amount after the power is applied to the auxiliary power supply, the auxiliary power storage by a first current source having a preset peak current level, determine, after the reference time amount, that the auxiliary power supply is in a slow charging state when a voltage level that is charged to the auxiliary power storage by the first current source for the reference time amount is lower than a reference voltage level and, increase, in response to the slow charging state, the peak current level to charge the auxiliary power storage by a second current source having the increased peak current level that is greater than the preset peak current level.

According to an embodiment of the present disclosure, a method of operating an auxiliary power supply may include inputting power to the auxiliary power supply, charging, for a reference time amount after the power is input to the auxiliary power supply, the auxiliary power supply by a first current source having a preset peak current level, determining, after the reference time amount, that the auxiliary power supply is in a slow charging state when a voltage level that is charged to the auxiliary power supply by the first current source for the reference time amount is lower than a reference voltage level, and increasing, in response to the slow charging state, the peak current level to charge the auxiliary power supply by a second current source having the increased peak current level that is greater than the preset peak current level.

According to an embodiment of the present disclosure, a storage device may include a memory device including a plurality of memory blocks for storing data, a memory controller configured to control the memory device, and an auxiliary power supply. The auxiliary power supply may include an auxiliary power storage configured to store auxiliary power that can be supplied in case supply of power to the memory device and the memory controller is abruptly stopped, and a control circuit, wherein the control circuit is configured to charge, for a reference time amount after the power is input to the auxiliary power supply, the auxiliary power storage by a first current source having a preset peak current level, determine, after the reference time amount, that the auxiliary power supply is in a slow charging state when a voltage level that is charged to the auxiliary power storage by the first current source for the reference time amount is lower than a reference voltage level, and increase, in response to the slow charging state, the peak current level to charge the auxiliary power storage by a second current source having the increased peak current level that is greater than the preset peak current level.

According to an embodiment of the present disclosure, a method of charging a power storage may include charging, for a preset time amount, the power storage by a first source having a preset current level and charging the power storage by a second source having a greater current level than the preset current level when a threshold is higher than a voltage level of the power storage charged by the first source for the preset time amount.

DETAILED DESCRIPTION

Specific structural and functional features of the present disclosure are disclosed in the context of the following embodiments of the disclosure. However, the present disclosure may be configured, arranged, or carried out differently than disclosed herein. Thus, the present disclosure is not limited to any particular embodiment nor to any specific details. Also, throughout the specification, reference to "an embodiment," "another embodiment" or the like is not necessarily to only one embodiment, and different references to any such phrase are not necessarily to the same embodiment. Moreover, the use of an indefinite article (i.e., "a" or "an") means one or more, unless it is clear that only one is intended. Similarly, terms "comprising," "including," "having" and the like, when used herein, do not preclude the existence or addition of one or more other elements in addition to the stated element(s).

It should be understood that the drawings are simplified schematic illustrations of the described devices and may not include well-known details to avoid obscuring the features of the invention.

It should also be noted that features present in one embodiment may be used with one or more features of another embodiment without departing from the scope of the invention.

It is further noted, that in the various drawings, like reference numbers designate like elements.

Figure 1:
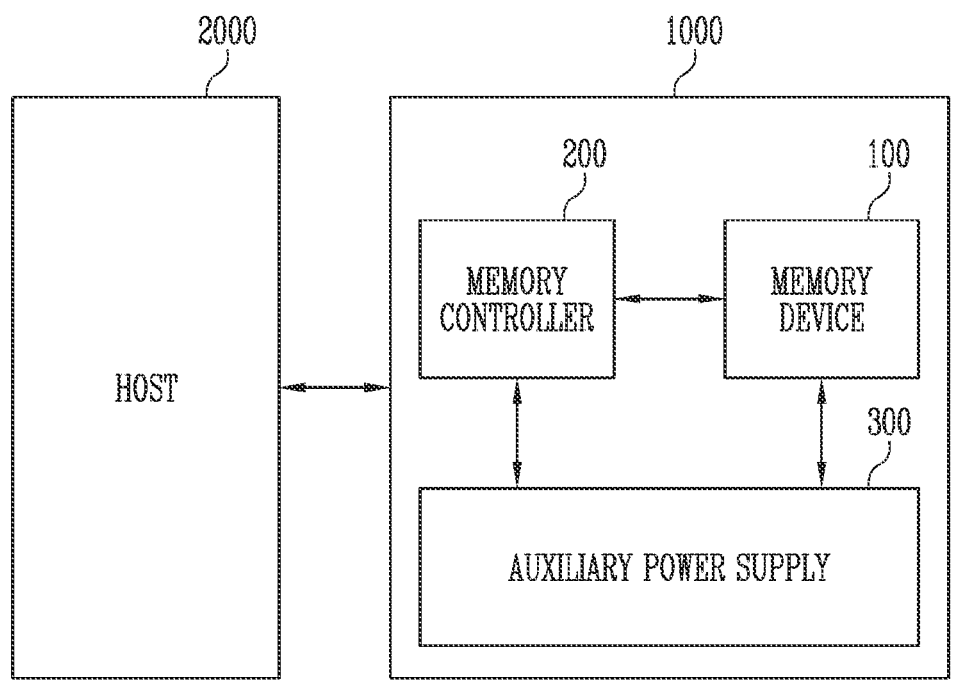
FIG. 1 is a diagram illustrating a storage device according to an embodiment of the present disclosure.

Hereinafter, various embodiments of the present disclosure are described in detail with reference to the accompanying drawings, FIG. 1 is a diagram illustrating a storage device 1000 according to an embodiment of the present disclosure.

Referring to FIG. 1, the storage device 1000 may include a memory device 100, a memory controller 200, and an auxiliary power supply 300.

The storage device 1000 may store data in response to control of a host 2000. Examples of the host 2000 may include a cellular phone, a smartphone, an MP3 player, a laptop computer, a desktop computer, a game player, a display device, a tablet PC, or an in-vehicle infotainment system.

The storage device 1000 may be embodied as one of various types of storage devices according to a host interface corresponding to a communication method with the host 2000. For example, the storage device 1000 may be embodied as any of various types of storage devices such as a Solid State Drive (SSD), a multimedia card in the form of a MultiMedia Card (MMC), an embedded MMC (eMMC), a Reduced-Size MMC (RS-MMC), or a micro-MMC, a secure digital card in the form of a Secure Digital (SD) card, a mini-SD card, or a micro-SD card, a Universal Serial Bus (USB) storage device, a Universal Flash Storage (UFS) device, a Personal Computer Memory Card International Association (PCMCIA) card type storage device, a Peripheral Component Interconnect (PCI) card type storage device, a PCI Express (PCI-e) card type storage device, a Compact Flash (CF) card, a smart media card, and a memory stick.

The storage device 1000 may be embodied as any of various types of packages. For example, the storage device 1000 may be embodied as any of various package types, such as a package on package (POP), a system an package (SIP), a system on chip (SOC), a multi-chip package (MCP), a chip on board (COB), a wafer-level fabricated package (WFP), and a wafer-level stack package (WSP).

The memory device 100 may store data or use stored data, More specifically, the memory device 100 may operate in response to control of the memory controller 200. The memory device 100 may include a plurality of memory dies, and each of the plurality of memory dies may include a memory cell array including a plurality of memory cells storing data.

Each of the memory cells may be configured as a Single-Level Cell (SLC) storing one bit of data, a Multi-Level Cell (MLC) storing two bits of data, a Triple-Level Cell (TLC) storing three bits of data, or a Quad-Level Cell (QLC) storing four bits of data.

The memory cell array may include a plurality of memory blocks. Each of the memory blocks may include a plurality of memory cells and each of the memory blocks may include a plurality of pages. The page may be a unit for storing data in the memory device 100 or reading data stored in the memory device 100.

The memory device 100 may be Double Data Rate Synchronous Dynamic Random Access Memory (DDR SDRAM), Low Power Double Data Rate 4 (LPDDR4) SDRAM, Graphics Double Data Rate (DDDR) SDRAM, Low Power DDR (LPDDR), Rambus Dynamic Random Access Memory (RDRAM), NAND flash memory, Vertical NAND flash memory, NOR flash memory, Resistive Random Access Memory (RRAM), Phase-Change Random Access Memory (PRAM), Magnetoresistive Random Access Memory (ARAM), Ferroelectric Random Access Memory (FRAM), or Spin-Transfer Torque Random Access Memory (STT-RAM). By way of example, the memory device 100 is NAND flash memory in the context of the following description.

The memory device 100 may receive a command and an address from the memory controller 200. The memory device 100 may be configured to access an area selected by the received address in the memory cell array. Accessing the selected area may refer to performing an operation corresponding to the received command on the selected area. For example, the memory device 100 may perform a write operation (or a program operation), a read operation, and an erase operation. The program operation may be an operation in which the memory device 100 writes data to the area selected by the address. The read operation may refer to an operation in which the memory device 100 reads data from the area selected by the address. The erase operation may refer to an operation in which the memory device 100 erases data from the area selected by the address.

The memory controller 200 may control general operations of the storage device 1000. More specifically, the memory controller 200 may execute firmware (FW) when power is supplied to the storage device 1000. The FW may include a Host Interface Layer (HIL) receiving a request input from the host 2000 or outputting a response to the host 2000, a Flash Translation Layer (FTL) managing an operation between an interface of the host 2000 and an interface of the memory device 100, and a Flash Interface Layer (FIL) providing a command to the memory device 100 or receiving a response from the memory device 100.

The memory controller 200 may receive data and a Logical Address (LA) from the host 2000 and translate the LA into a Physical Address (PA) indicating addresses of memory cells, in which data is to be stored, included in the memory device 100. The LA may be a Logical Block Address (LBA) and the PA may be a Physical Block Address (PBA).

The memory controller 200 may control the memory device 100 to perform a program operation, a read operation or an erase operation in response to a request from the host 2000. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

The memory controller 200 may control the memory device 100 to perform a program operation, a read operation or an erase operation independently of the request from the host 2000. For example, the memory controller 200 may control the memory device 100 to perform a program operation, a read operation, or an erase operation used to perform background operations such as wear leveling, garbage collection and read reclaim.

The auxiliary power supply 300 may supply auxiliary power to the memory device 100 and the memory controller 200. When a Sudden Power Loss (SPL) occurs, the memory device 100 and the memory controller 200 may perform an internal operation or the like using the auxiliary power supplied from the auxiliary power supply 300.

The auxiliary power supply 300 may be suppliedwith power from an external device (e.g., the host 2000) and the auxiliary power supply 300 may perform a charge operation for storing the supplied power in the form of electric energy. The electric energy stored in the auxiliary power supply 300 may be supplied to the memory device 100 and the memory controller 200 when main power is not smoothly supplied. When the SPL occurs, the auxiliary power supply 300 may supply the auxiliary power to the memory device 100 and the memory controller 200, thereby ensuring stability of the memory device 100 and the memory controller 200.

Anomalous Charge Current (ACC) characteristics of the auxiliary power supply 300 may be developed in a predetermined environment. The ACC characteristics may refer to a phenomenon in which a greater amount of a charging current is required due to characteristics of a material when a charging voltage is applied. In other words, charge of the auxiliary power supply 300 may be delayed when the ACC characteristics are developed. However, according to an embodiment of the present disclosure, even when the ACC characteristics are developed, the auxiliary power supply 300 may quickly complete a charge operation by adjusting a peak current level after a reference time amount elapses.

The host 2000 may communicate with the storage device 1000 using at least one of various communication standards or interfaces such as Universal Serial Bus (USB), Serial Advanced Technology Attachment (SATA), Serial Attached SCSI (SAS), High Speed Interchip (HSIC), Small Computer System Interface (SCSI), Peripheral Component Interconnect (PCI), PCI Express (PCI-e), Nonvolatile Memory express (NVMe), Universal Flash Storage (UFS), Secure Digital (SD), Multi Media Card (MMC), embedded MMC (eMMC), Dual In-line Memory Module (DIMM), Registered DIMM (RDIMM and Load Reduced DIMM (LRDIMM) communication methods.

Figure 2:
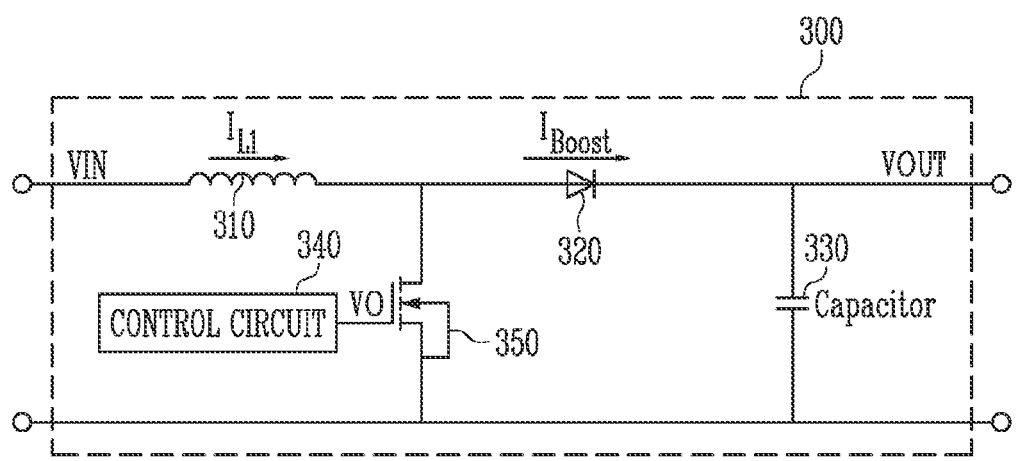
FIG. 2 is a diagram illustrating an auxiliary power supply according to an embodiment of the present disclosure.

FIG. 2 is a diagram illustrating the auxiliary power supply 300 according to an embodiment of the present disclosure.

Referring to FIG. 2, the auxiliary power supply 300 may include an inductor 310, a unidirectional element 320, a capacitor 330, a control circuit 340, and a switching element 350.

The inductor 310 may form an induced electromotive force from change in current according to a time change using an electromagnetic induction phenomenon. Inductance of the inductor 310 may be L and a current that flows in the inductor 310 may be $I_{L1}$.

The unidirectional element 320 lay form a current path according to a voltage level. Because the unidirectional element 320 allows only a current path in a predetermined direction, a current path may be formed according to a voltage level difference between a voltage level VIN input to the auxiliary power supply 300 and a voltage level VOUT output from the auxiliary power supply 300. A current that flows in the unidirectional element 320 may be $I_{Boost}$. The unidirectional element 320 may be embodied as a diode.

The capacitor 330 may be charged with electric energy by a current of main power supplied to the auxiliary power supply 300. When the SPL, which is a case where supply of main power to the storage device 1000 is stopped, occurs, the electric energy charged in the capacitor 330 may be supplied to the memory device 100 or the memory controller 200. According to an embodiment of the present disclosure, the capacitor 330 may be embodied as a polymer capacitor, and more specifically, as a polymer tantalum capacitor.

The control circuit 340 may control operations of the auxiliary power supply 300 and monitor the capacitor 330 or the like. For example, the control circuit 340 may monitor a charged voltage level of the capacitor 330. The control circuit 340 may monitor the charged voltage level of the capacitor 330 to compare and determine whether the charged voltage level is lower than a reference voltage level. When the voltage level charged to the capacitor 330 for a reference time amount is lower than the reference voltage level, the control circuit 340 may determine an operating state of the auxiliary power supply 300 as a slow charging state. When the control circuit 340 determines that the auxiliary power supply 300 is in the slow charging state, the control circuit 340 may adjust settings of the auxiliary power supply 300 to increase a charging speed of the auxiliary power supply 300. More specifically, the control circuit 340 may adjust and increase the charging speed of the auxiliary power supply 300 by increasing a peak current level. The charge operation of the auxiliary power supply 300 is described in detail below with reference to FIG. 3.

Figure 3:
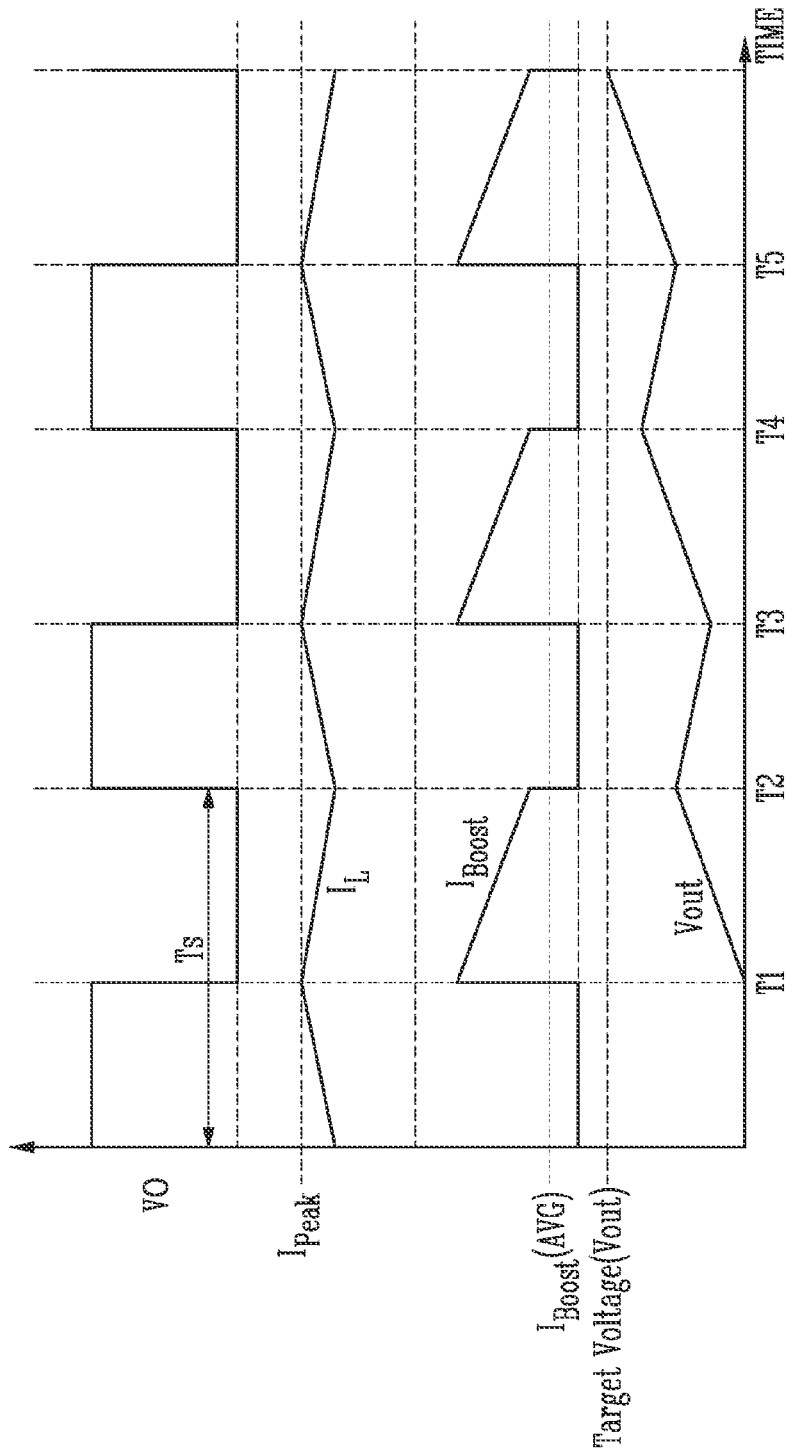
FIG. 3 is a diagram illustrating a charge operation according to an embodiment of the present disclosure.

FIG. 3 is a diagram illustrating a charge operation according to an embodiment of the present disclosure.

Referring to FIG. 3, an operation of charging the auxiliary power supply 300 as time passes is illustrated. FIG. 3 is a timing diagram illustrating that the auxiliary power supply 300 is charged up to a target voltage level without a problem such as development of ACC characteristics.

An operation signal VO of the auxiliary power supply 300 may be the operation signal VO generated by the control circuit 340 shown in FIG. 2. The operation signal VO may be generated in a period $T_S$ and the switching element 350 may be opened or closed according to the operation signal VO. That is, the operation signal VO generated by the control circuit 340 may be a switching signal that operates the switching element 350. For example, when the operation signal VO has a high level, the switching element 350 may be opened and when the operation signal VO has a low level, the switching element 350 may be closed. Until the auxiliary power supply 300 is completely charged, the operation signal VO may be applied at a low level or a high level and may be generated in a regular period (for example, $T_S$).

$I_L$ may be a current that flows in the inductor 310 shown in FIG. 2 and a current level of $I_L$ may be limited to $I_{Peak}$, $I_{Boost}$ may be a current that flows in the unidirectional element 320 shown in FIG. 2 and an average of levels of $I_{Boost}$ may be $I_{Boost}(AVG)$. Vout may be a voltage level output from the auxiliary power supply 300 and may indicate a voltage level charged to the capacitor 330 shown in FIG. 2.

Referring to FIGS. 2 and 3, the charge operation of the auxiliary power supply 300 may be performed according to [Equation 1] below. That is, a current source that charges the auxiliary power supply 300 may follow [Equation 1] below.

[Equation 1]

$$I\,Boost(AVG) = \frac{\left(\left(\frac{1}{VIN} + \frac{1}{(VOUT-VIN)}\right)*L*I_{peak}^2*VIN*E\right)}{(2Ts*VOUT)}$$

Here, L may be inductance of the inductor 310 shown in FIG. 2 and E may be charging efficiency of the auxiliary power supply 300. The other values in [Equation 1] are shown in or are described with reference to FIG. 2 or FIG. 3.

Figure 4:
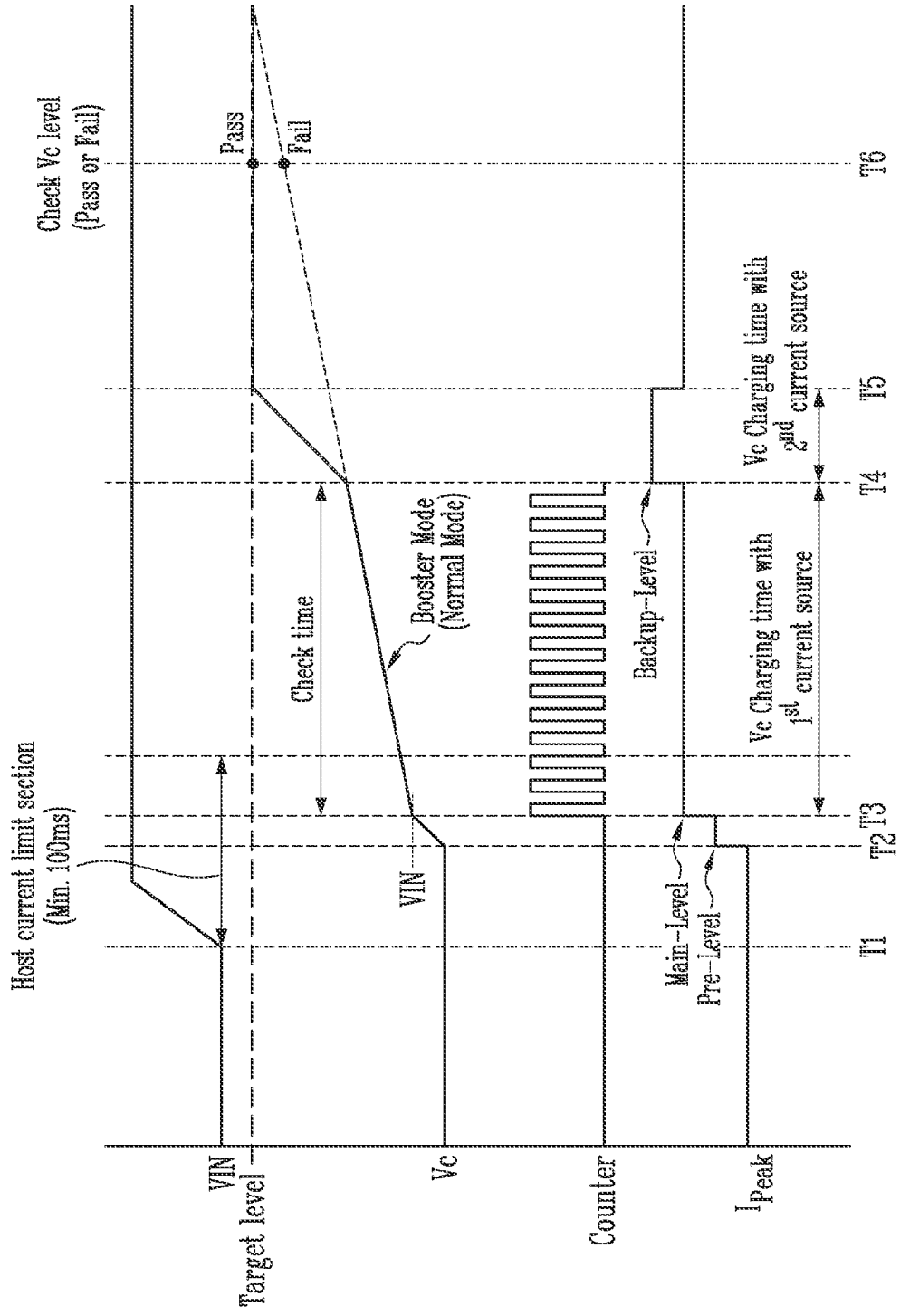
FIG. 4 is a timing diagram illustrating operations of an auxiliary power supply according to an embodiment of the present disclosure.

FIG. 4 is a timing diagram illustrating an operation of an auxiliary power supply according to an embodiment of the present disclosure.

Referring to FIG. 4, the timing diagram including information related to an internal operation of the auxiliary power supply 300 is illustrated. VIN is a voltage (or power) input to the auxiliary power supply 300 and may be VIN of FIG. 2. Vc may refer to a charged voltage level that is charged to the auxiliary power supply 300 and Counter may indicate a signal generated by a counter 342 to be described below included in the control circuit 340. $I_{Peak}$ is a peak current level and a current that flows in the inductor 310 of FIG. 2 may be determined according to the peak current level.

When power is input to the auxiliary power supply 300 at a first time point T1, a charge operation for storing the input power VIN in the auxiliary power supply 300 may be performed. A current that flows in the storage device 1000 may be limited for a predetermined time period after the storage device 1000 is powered on. For example, a current level of the maximum current that flows in the auxiliary power supply 300 may be limited for a predetermined time period (for example, for 100 ms) from the first time point T1. Namely, the storage device 1000 may increase a current level of the maximum current that flows in the auxiliary power supply 300 after a charge limit time amount, for which the current level of the maximum current in the auxiliary power supply 300 is limited, elapses after the power is input to the auxiliary power supply 300 at the first time point T1. The current level that is limited for the charge limit time amount may be a second level which is a current level of a current that flows in the inductor 310 in the period between a third time point T3 and a fourth time point T4. The peak current level $I_{Peak}$ that indicates the maximum current level of a current which is allowed to flow in the inductor 310 is changed to a first level at a second time point T2, and a current may flow in the inductor 310 according to the peak current level $I_{Peak}$. The peak current level $I_{Peak}$ of the first level may be a current level prior to charge of the auxiliary power supply 300 or a current level at a preliminary stage for charge.

In addition, the peak current level $I_{Peak}$ may be changed to the second level at the third time point T3 and a current level of the current $I_L$ that flows in the inductor 310 may be changed according to the peak current level $I_{Peak}$ of the second level. When the switching signal is applied at the third time point T3, the auxiliary power supply 300 may start to be charged according to the switching signal. According to an embodiment, the auxiliary power supply 300 may be charged in the period between the third tame point T3 and a fifth time point T5. The auxiliary power supply 300 may be charged by a first current source that is determined according to the peak current level of the second level (e.g., a main level) from the third time point T3. The first level of the peak current level may be a pre-level to reduce a load at a time point when the charge operation starts and the second level of the peak current level may be a main level at which the charge operation is mainly performed.

It may be determined whether the auxiliary power supply 300 is sufficiently charged in the period between the third time point T3 and the fourth time point T4. More specifically, the auxiliary power supply 300 may set the period between the third time point T3 and the fourth time point T4 as a reference time amount. The auxiliary power supply 300 may compare the charged voltage level that is charged to the auxiliary power supply 300 for the reference time amount with the reference voltage level.

It may be determined that the auxiliary power supply 300 is in a state of not sufficiently being charged when the charged voltage level that is charged to the auxiliary power supply 300 is lower than the reference voltage level at the fourth time point T4. That is, when the charged voltage level that is charged to the auxiliary power supply 300 is lower than the reference voltage level at the fourth time point T4, it may be determined that even when the auxiliary power supply 300 is charged until a sixth time point T6, the charged voltage level would be lower than a target level. For example, when the auxiliary power supply 300 is not charged to the reference voltage level for the reference time amount, that is, in the period between the third time point T3 and the fourth time point 14, it may be determined that the auxiliary power supply 300 is in the slow charging state. The reference voltage level may refer to a charged voltage level at the fourth time point T4 that is charged to the auxiliary power supply 300 when the auxiliary power supply 300 is charged to the target level at a constant speed in the period between the third time point T3 and the sixth time point T6.

When the auxiliary power supply 300 is determined to be in the slow charging state, the auxiliary power supply 300 may change the peak current level which indicates the maximum current level of the current IL that is allowed to flow in the inductor 310 from the second level (or the main level) to a third level (or a backup level). The auxiliary power supply 300 may increase a current level of the current source that charges the capacitor 320 by changing the peak current level from the second level to the third level higher than the second level.

When the charged voltage level reaches the target level at the fifth time point T5, the auxiliary power supply 300 may change the peak current level back to the second level. After the sixth time point T6, the charge operation of the auxiliary power supply 300 may be completed.

Figure 5:
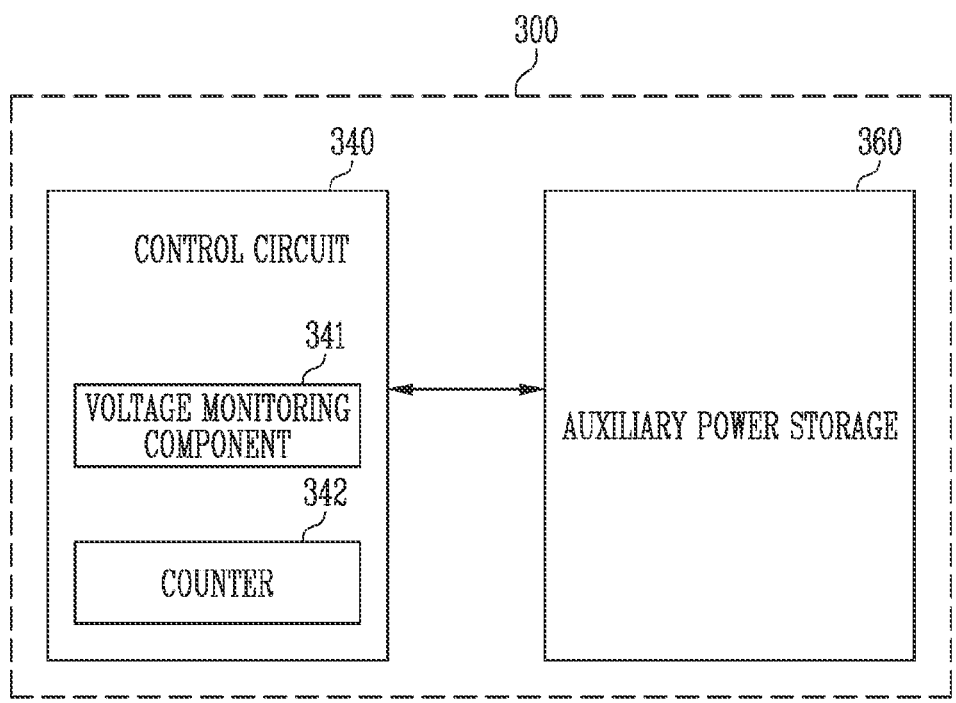
FIG. 5 is a diagram illustrating a control circuit and an auxiliary power storage according to an embodiment of the present disclosure.

FIG. 5 is a diagram illustrating the control circuit 340 and an auxiliary power storage 360 according to an embodiment of the present disclosure.

Referring to FIG. 5, the auxiliary power supply 300 may include the control circuit 340 and the auxiliary power storage 360.

The control circuit 340 may include a voltage monitoring component 341 and the counter 342. The voltage monitoring component 341 may monitor a voltage level that is charged to the auxiliary power storage 360 and compare the charged voltage level with the reference voltage level. The control circuit 340 may monitor the voltage level that is charged to the auxiliary power storage 360 using the voltage monitoring component 341. The counter 342 may calculate a reference time amount. More specifically, the counter 342 may generate signals in a regular period and calculate the reference time amount based on the number of generated signals.

The auxiliary power storage 360 may include the inductor 310, the unidirectional element 320, and the capacitor 330. The auxiliary power storage 360 may include the inductor 310, the unidirectional element 320, and the capacitor 330 to store a current source that is input to the auxiliary power supply 300. When an SPL occurs, power stored in the auxiliary power storage 360 may be supplied, as auxiliary power, to the memory device 100 or the memory controller 200.

Figure 6:
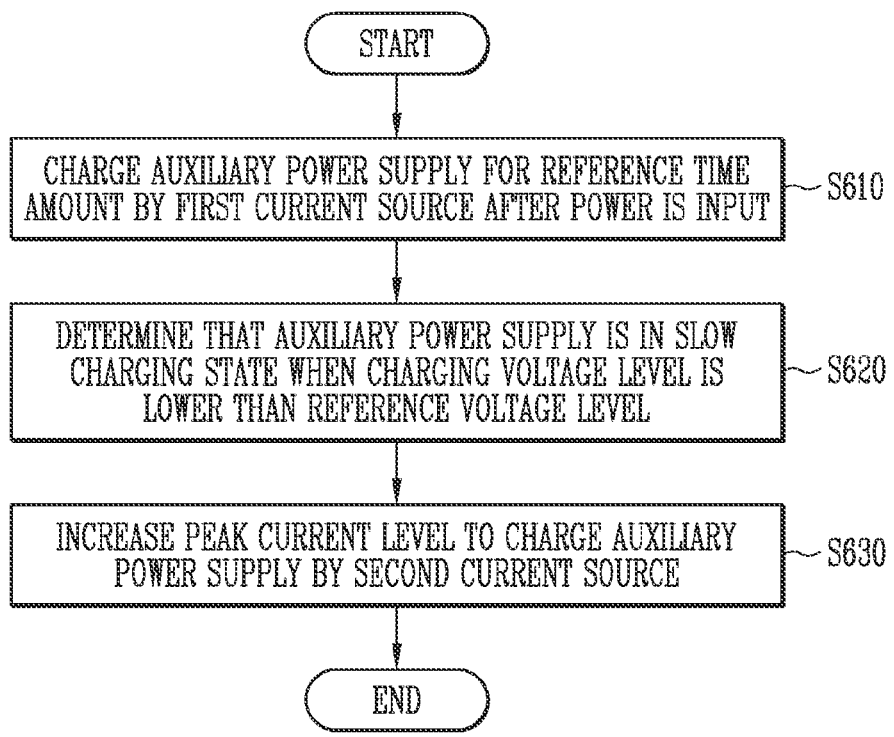
FIG. 6 is a diagram illustrating a method of operating an auxiliary power supply according to an embodiment of the present disclosure.

FIG. 6 is a diagram illustrating a method of operating the auxiliary power supply 300 according to an embodiment of the present disclosure.

When a predetermined event occurs (e.g., a sudden power loss (SPL)), the auxiliary power supply 300 may supply auxiliary power to the memory device 100 or the memory controller 200. Referring to FIG. 6, the method of operating the auxiliary power supply 300 is illustrated.

When power is input to the auxiliary power supply 300, the auxiliary power supply 300 may start to be charged. More specifically, after the power is input to the auxiliary power supply 300, the auxiliary power supply 300 may be charged for a reference time amount by a first current source which is determined according to a preset peak current level (S610). A polymer capacitor included in the auxiliary power supply 300 may be charged by the first current source.

When a voltage level that is charged to the auxiliary power supply 300 is lower than a reference voltage level, it may be determined that the auxiliary power supply 300 is in a slow charging state (S620). More specifically, after the reference time amount, the voltage level that is charged to the auxiliary power supply 300 is compared with the reference voltage level and determined whether to be lower than the reference voltage level. When the voltage level that is charged to the auxiliary power supply 300 is lower than the reference voltage level, it may be determined that the auxiliary power supply 300 is in the slow charging state.

In response to the slow charging state, the auxiliary power supply 300 may increase the peak current level to charge the auxiliary power supply 300 by a second current source having the increased peak current level that is greater than the preset peak current level (S630). The auxiliary power supply 300 may increase a current level of a current source that charges the auxiliary power supply 300 by increasing a peak current level.

When the voltage level charged to the auxiliary power supply 300 reaches the reference voltage level, the auxilia power supply 300 may decrease the peak current level to change the second current source to the first current source that was previously used.

According to an embodiment of the present disclosure, the auxiliary power supply 300 may increase a current level of the current source that charges the auxiliary power supply 300 by changing a switching signal that operates a switching element. The switching signal may be a signal that operates the switching element 350 shown in FIG. 2. More specifically, the auxiliary power supply 300 may periodically generate the switching signal that operates the switching element 350 when the auxiliary power supply 300 is charged. When the auxiliary power supply 300 is in the slow charging state, the auxiliary power supply 300 may reduce a period of the generating of the switching signal. The auxiliary power supply 300 may increase a current level of a current source that charges the auxiliary power supply 300 by reducing the period of the generating of the switching signal, FIG. 7 is a diagram illustrating the memory device 100 according to an embodiment of the present disclosure.

Figure 7:
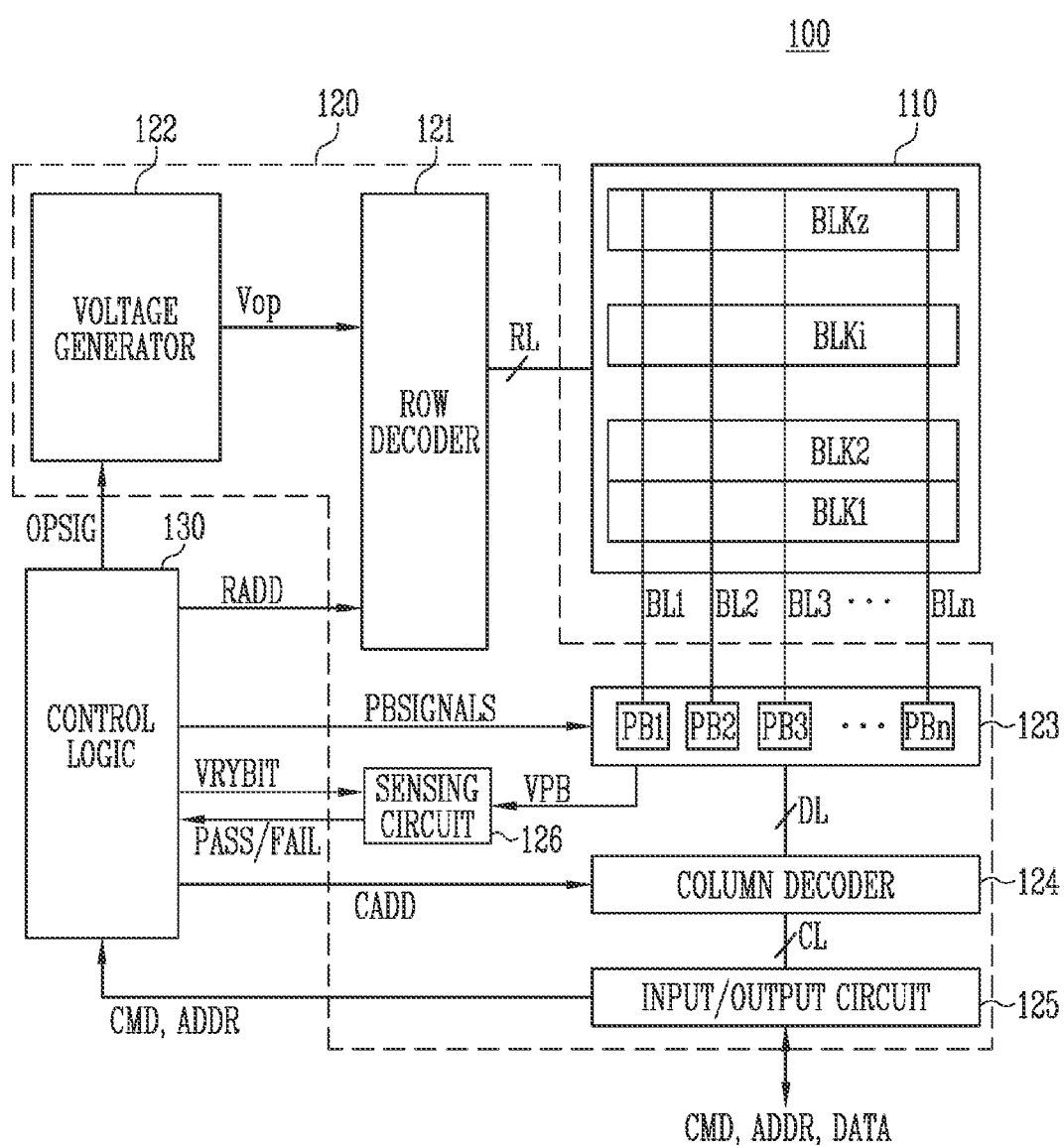
FIG. 7 is a diagram illustrating a memory device according to an embodiment of the present disclosure.

Referring to FIG. 7, the memory device 100 may include a memory cell array 110, a peripheral circuit 120, and control logic 130.

The memory cell array 110 may include a plurality of memory blocks BLK1 to BLKz. The plurality of memory blocks BLK1 to BLKz may be coupled to a row decoder 121 through row lines RL. The row lines RL may include at least one source select line, a plurality of word lines, and at least one drain select line. The plurality of memory blocks BLK1 to BLKz may be coupled to a page buffer group 123 through bit lines BL1 to BLn. Each of the plurality of memory blocks BLK1 to BLKz may include a plurality of memory cells. According to an embodiment, the plurality of memory cells may be nonvolatile memory cells. Memory cells coupled to the same word line may be defined as one page. Therefore, one memory block may include a plurality of pages.

Each of the memory cells included in the memory cell array 110 may be configured as a Single-Level Cell (SLC) storing one bit of data, a Mufti-Level Cell (MLC) storing two bits of data, a Triple-Level cell (TLC) storing three bits of data, or a Quad-Level Cell (QLC) storing four bits of data.

The peripheral circuit 120 may be configured to perform a program, read, or erase operation on a selected area of the memory cell array 110 in response to control of the control logic 130. That is, the peripheral circuit 120 may drive the memory cell array 110 in response to the control of the control logic 130. For example, the peripheral circuit 120 may apply various operating voltages to the row lines RL and the bit lines BL1 to BLn or discharge the applied voltages in response to the control of the control logic 130.

More specifically, the peripheral circuit 120 may include the row decoder 121, a voltage generator 122, the page buffer group 123, a column decoder 124, an input/output circuit 125, and a sensing circuit 126.

The row decoder 121 may be coupled to the memory cell array 110 through the row lines RL. The row lines RL may include at least one source select line, a plurality of word lines, and at least one drain select line. According to an embodiment, the plurality of word lines may include normal word lines and dummy word lines. In addition, the row lines RL may further include a pipe select line.

The row decoder 121 may be configured to operate in response to control of the control logic 130. The row decoder 121 may receive a row address RADD from the control logic 130. More specifically, the row decoder 121 may be configured to decode the row address RADD. The row decoder 121 may select at least one of the memory blocks BLK1 to BLKz according to the decoded row address RADD. In addition, the row decoder 121 may select at least one word line of the word lines of the selected memory block to apply voltages generated by the voltage generator 122 to at least one word line according to the decoded row address RADD.

For example, during a program operation, the row decoder 121 may apply a program voltage to the selected word line and a program pass voltage having a lower voltage level than the program voltage to unselected word lines. During a program verify operation, the row decoder 121 may apply a verify voltage to the selected word line and a verify pass voltage having a higher voltage level than the verify voltage to the unselected word lines. During a read operation, the row decoder 121 may apply a read voltage to the selected word line and a read pass voltage having a higher voltage level than the read voltage to the unselected word lines.

According to an embodiment, an erase operation of the memory cell array 110 may be performed in units of memory blocks. During the erase operation, the row decoder 121 may select one memory block according to a decoded address and may apply a ground voltage to word lines coupled to the selected memory block.

The voltage generator 122 nay operate in response to control of the control logic 130. More specifically, the voltage generator 122 may be configured to generate a plurality of voltages by using an external power voltage which is supplied to the memory device 100, in response to the control of the control logic 130. For example, the voltage generator 122 may generate a program voltage, a verify voltage, a pass voltage, a read voltage, an erase voltage, and the like, in response to the control of the control logic 130. That is, the voltage generator 122 may generate various operating voltages Vop applied to perform program, read and erase operations in response to an operation signal OPSIG.

According to an embodiment, the voltage generator 122 may generate an internal power voltage by regulating an external power voltage. The internal power voltage generated by the voltage generator 122 may be used as an operating voltage of the memory cell array 110.

According to an embodiment, the voltage generator 122 may generate a plurality of voltages by using the external power voltage or the internal power voltage. For example, the voltage generator 122 may include a plurality of pumping capacitors receiving the internal power voltage and generate the plurality of voltages by selectively activating the plurality of pumping capacitors in response to the control of the control logic 130. The plurality of voltages generated by the voltage generator 122 may be supplied to the memory cell array 110 by the row decoder 121.

The page buffer group 123 may include first to nth page buffers PB1 to PBn. The first to nth page buffers PB1 to PBn may be coupled to the memory cell array 110 through the first to nth bit lines BL1 to BLn, respectively. In addition, the first to nth page buffers PB1 to PBn may operate in response to control of the control logic 130. More specifically, the first to nth page buffers PB1 to PBn may operate in response to page buffer control signals PBSIGNALS. For example, the first to nth page buffers PB1 to PBn may temporarily store data received through the first to nth bit lines BL1 to BLn or may sense voltages or currents of the bit lines BL1 to BLn during a read or verify operation.

More specifically, during a program operation, the first to nth page buffers PB1 to PBn may transfer data DATA received through the input/output circuit 125 to selected memory cells through the first to nth bit lines BL1 to BLn when a program pulse is applied to a selected word line. Memory cells of a page selected according to the transferred data DATA may be programmed. A memory cell coupled to a bit line to which a program permission voltage (for example, a ground voltage) is applied may have an increased threshold voltage. A threshold voltage of a memory cell coupled to a bit line to which a program inhibition voltage (for example, a power voltage) is applied may be maintained.

During a program verify operation, the first to nth page buffers PB1 to PBn may read page data from the selected memory cells through the first to nth bit lines BL1 to BLn.

During a read operation, the first to nth page buffers PB1 to PBn may read the data DATA from the memory cells of the selected page through the first to nth bit lines BL1 to BLn and output the read data DATA to the input/output circuit 125 in response to control of the column decoder 124.

During an erase operation, the first to nth page buffers PB1 to PBn may float the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL, or may exchange data with the input/output circuit 125 through column lines CL.

The input/output circuit 125 may transfer a command CMD and an address ADDR received from the memory controller 200 to the control logic 130, or may exchange the data DATA with the column decoder 124.

The sensing circuit 126 may generate a reference current in response to an allowable bit signal VRYBIT and compare a sensing voltage VPB received from the page buffer group 123 with a reference voltage generated by the reference current to output a pass signal PASS or a fail signal FAIL during a read operation or a verify operation.

The control logic 130 may control the peripheral circuit 120 by outputting the operation signal OPSIG, the row address RADD, the page buffer control signals PBSIGNALS, and the allowable bit signal VRYBIT in response to the command CMD and the address ADDR.

In addition, the control logic 130 may determine whether a verify operation passes or fails in response to the pass signal PASS or the fail signal FAIL. In addition, the control logic 130 may control the page buffer group 123 to temporarily store verification information including the pass signal PASS or the fail signal FAIL.

Figure 8:
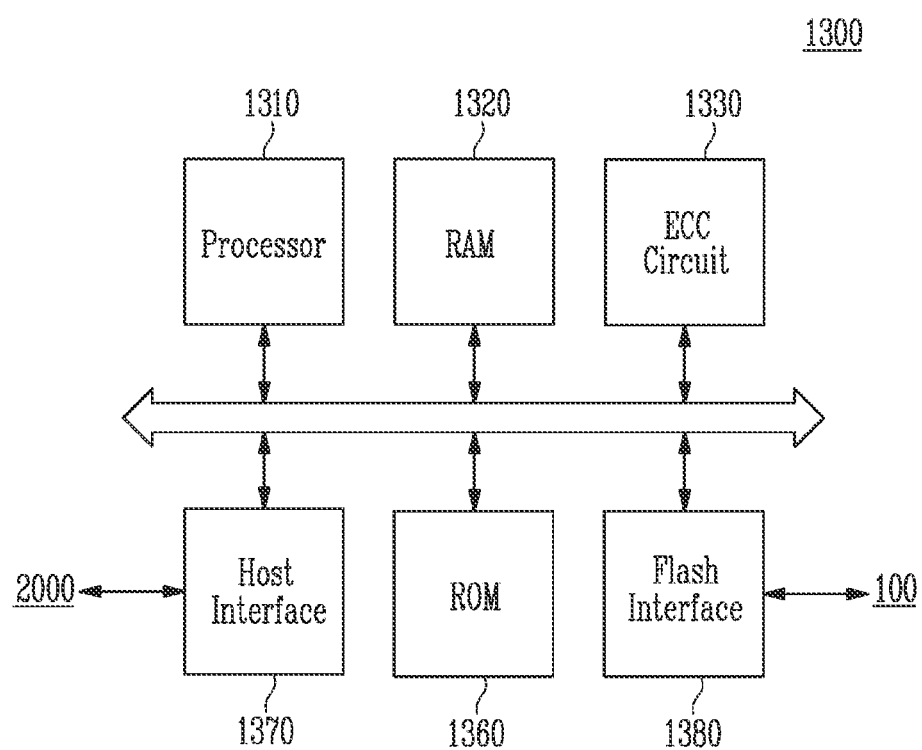
FIG. 8 is a diagram illustrating a memory controller according to an embodiment of the present disclosure.

FIG. 8 is a diagram illustrating a memory controller 1300 according to an embodiment of the present disclosure.

Referring to FIG. 8, the memory controller 1300 may include a processor 1310, Random Access Memory (RAM) 1320, an Error Correction Code (ECC) circuit 1330, Read Only Memory (ROM) 1360, a host interface 1370, and a flash interface 1380. The memory controller 1300 illustrated in FIG. 8 may be an embodiment of the memory controller 200 shown in FIG. 1.

The processor 1310 may communicate with the host 2000 using the host interface 1370 and perform a logical operation to control an operation of the memory controller 1300. For example, the processor 1310 may load a program command, a data file, a data structure, or the like, in response to a request received from the host 2000 or an external device, perform various operations, or generate a command and an address. For example, the processor 1310 may generate various commands used for performing a program operation, a read operation, an erase operation, a suspend operation, and a parameter setting operation.

The processor 1310 may perform a function of a Flash Translation Layer (FTL). The processor 1310 may translate a Logical Block Address (LBA), provided by the host 2000, into a Physical Block Address (PBA) through the FTL. The FTL may receive the LBA and translate the LBA into the PBA by using a mapping table. There are various address mapping methods of the FTL depending on a mapping unit. Typical address mapping methods include a page mapping method, a block mapping method, and a hybrid mapping method.

The processor 1310 may generate a command without requests from the host 2000. For example, the processor 1310 may generate a command for background operations such as operations for wear leveling of the memory device 100 and operations for garbage collection of the memory device 100.

The RAM 1320 may serve as a buffer memory, operating memory, or cache memory of the processor 1310. The RAM 1320 may store codes and commands executed by the processor 1310. The RAM 1320 may store data processed by the processor 1310. When the RAM 1320 is implemented, the RAM 1320 may include Static RAM (SRAM) or Dynamic RAM (DRAM).

The ECC circuit 1330 may detect and correct an error during a program operation or a read operation. More specifically, the ECC circuit 1330 may perform an error correction operation according to an Error Correction Code (ECC). The ECC circuit 1330 may perform ECC encoding based on data to be written to the memory device 100. The data to which the ECC encoding is performed may be transferred to the memory device 100 through the flash interface 1380. In addition, the ECC circuit 1330 may perform ECC decoding on data received from the memory device 100 through the flash interface 1380.

The ROM 1360 may serve as a storage unit storing various types of information used for operations of the memory controller 1300. More specifically, the ROM 1360 may include a map table and the map table may store physical-to-logical address information and logical-to-physical address information. The ROM 1360 may be controlled by the processor 1310.

The host interface 1370 may include a protocol for exchanging data between the host 2000 and the memory controller 1300. More specifically, the host interface 1370 may communicate with the host 2000 through one or more various interface protocols such as a Universal Serial Bus (USB) protocol, a MultiMedia Card (MMC) protocol, a Peripheral Component Interconnect (PCI) protocol, a PCI Express (PCI-e) protocol, an Advanced Technology Attachment (ATA) protocol, a Serial-ATA (SATA) protocol, a Parallel-ATA (DATA) protocol, a Small Computer System Interface (SCSI) protocol, an Enhanced Small Disk Interface (ESDI) protocol, an Integrated Drive Electronics (IDE) protocol, and a private protocol.

The flash interface 1380 may communicate with the memory device 100 using a communication protocol according to control of the processor 1310. More specifically, the flash interface 1380 may communicate commands, addresses, and data with the memory device 100 through channels. For example, the flash interface 1380 may include a NAND interface.

Figure 9:
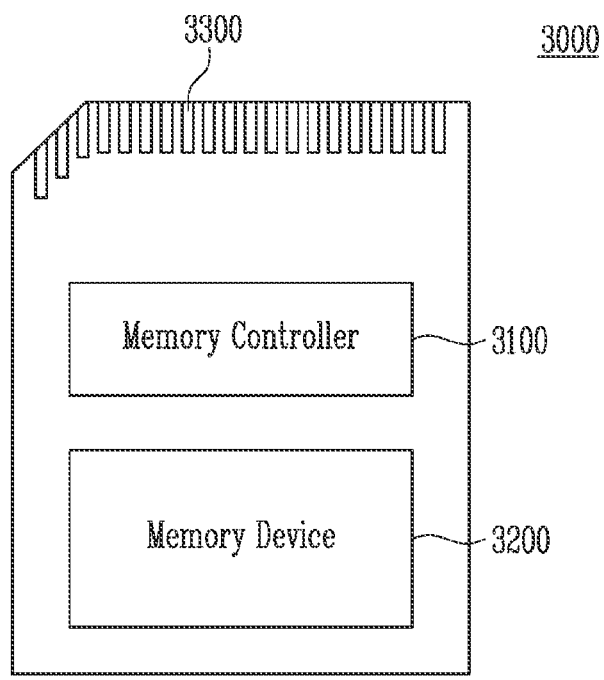
FIG. 9 is a diagram illustrating a memory card system according to an embodiment of the present disclosure.

FIG. 9 is a diagram illustrating a memory card system 3000 according to an embodiment of the present disclosure.

Referring to FIG. 9, the memory card system 3000 may include a memory controller 3100, a memory device 3200 and a connector 3300.

The memory controller 3100 may be electrically coupled to the memory device 3200 and may be configured to access the memory device 3200. For example, the memory controller 3100 may be configured to control a read operation, a write operation, an erase operation, and a background operation on the memory device 3200. The memory controller 3100 may be configured to provide an interface between the memory device 3200 and a host. The memory controller 3100 may run firmware for controlling the memory device 3200.

For example, the memory controller 3100 may include components such as Random Access Memory (RAM), a processing unit, a host interface, a memory interface, and an Error Correction Code (ECC) block.

The memory controller 3100 may communicate with an external device through the connector 3300. The memory controller 3100 may communicate with the external device (e.g., a host) based on a specific communication protocol. For example, the memory controller 3100 may be configured to communicate with the external device through at least one of various communication standards or interfaces such as Universal Serial Bus (USB), MultiMedia card (MMC), embedded MMC (eMMC), Peripheral Component Interconnect (PCI), PCI Express (PCI-e), Advanced Technology Attachment (ATA), Serial-ATA (SATA), Parallel-ATA (PATA), Small Computer System Interface (SCSI), Enhanced Small Disk Interface (ESDI), Integrated Drive Electronics (IDE), Firewire, Universal Flash Storage (UFS), WiFi, Bluetooth, and Nonvolatile Memory express (NVMe) protocols. For example, the connector 3300 may be defined by at least one of the above-described various communication standards or interfaces.

In an embodiment, the memory device 3200 may be embodied as any of various nonvolatile memory elements, such as Electrically Erasable and Programmable ROM (EEPROM), NAND flash memory, NOR flash memory, Phase-change RAM (PRAM), Resistive RAM (ReRAM), Ferroelectric RAM (FRAM), and Spin-Transfer Torque Magnetic RAM (STT-MRAM).

The memory controller 3100 and the memory device 3200 may be integrated into a single semiconductor device to form a memory card. For example, the memory controller 3100 and the memory device 3200 may be integrated into a single semiconductor device and form a memory card such as a Personal Computer Memory Card International Association (PCMCIA) card, a Compact Flash (CF) card, a smart media card (SM or SMC), a memory stick, a multimedia card in the form of a MultiMedia Card (MMC), a Reduced-Size MMC (RS-MMC), a micro-MMC, or an embedded MMC (eMMC), a secure digital card in the form of a Secure Digital (SD) card, a mini-SD card, a micro-SD card, or a Secure Digital High Capacity (SDHC) card, and a Universal Hash Storage (UFS).

Figure 10:
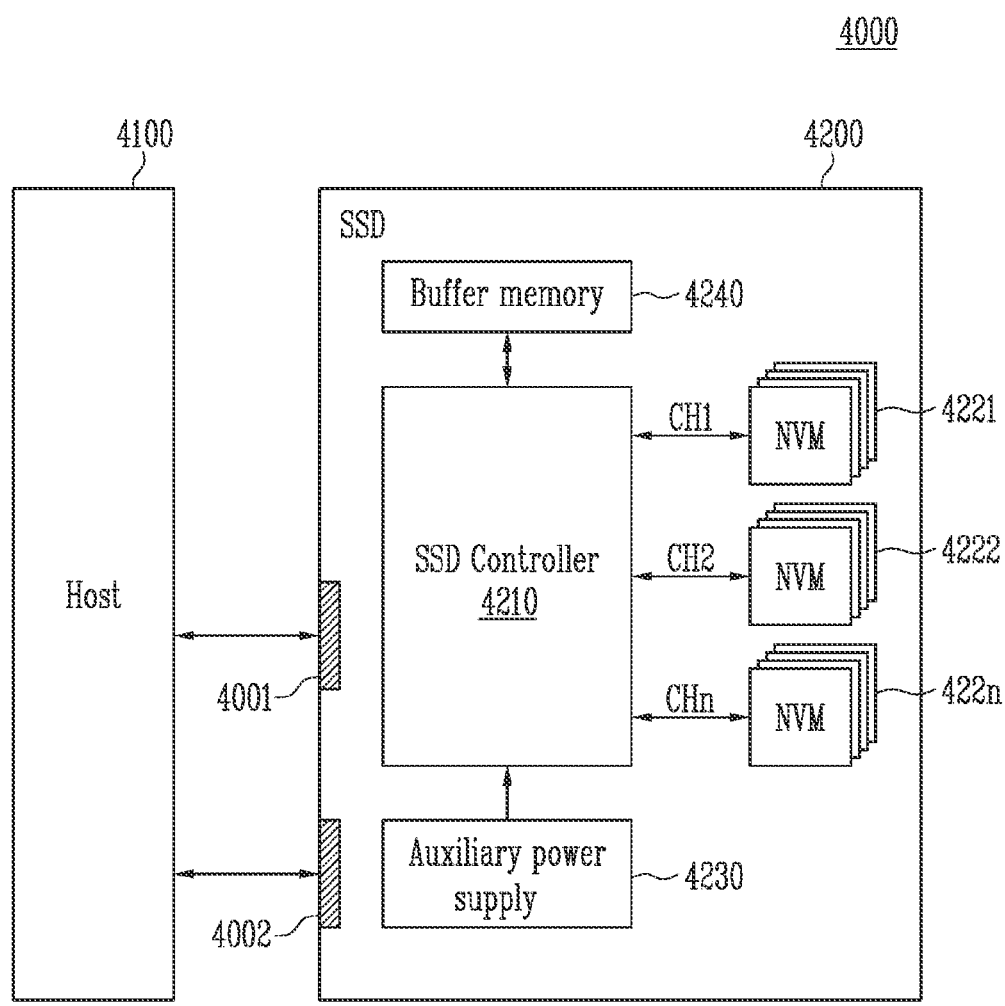
FIG. 10 is a diagram illustrating a Solid State Drive (SSD) system according to an embodiment of the present disclosure.

FIG. 10 is a diagram illustrating a Solid State Drive (SSD) system 4000 according to an embodiment of the present disclosure.

Referring to FIG. 10, the SSD system 4000 may include a host 4100 and an SSD 4200. The SSD 4200 may exchange signals with the host 4100 through a signal connector 4001 and may receive power through a power connector 4002. The SSD 4200 may include an SSD controller 4210, a plurality of flash memory 4221 to 422n, an auxiliary power supply 4230, and buffer memory 4240.

In an embodiment, the SSD controller 4210 may perform the function of the memory controller 200 described above with reference to FIG. 1. The SSD controller 4210 may control the plurality of flash memory 4221 to 422n in response to the signals received from the host 4100. For example, the signals may be signals based on interfaces of the host 4100 and the SSD 4200. For example, the signals may be defined by at least one of various communication standards or interfaces such as Universal Serial Bus (USB), MultiMedia Card (MMC), embedded MMC (eMMC), Peripheral Component Interconnect (PCI), PCI Express (PCI-e), Advanced Technology Attachment (ATA), Serial-ATA (SATA), Parallel-ATA (DATA), Small Computer System Interface (SCSI), Enhanced Small Disk Interface (ESDI), Integrated Drive Electronics (IDE), Firewire, Universal Hash Storage (UFS), Wi-Fi, Bluetooth, and Nonvolatile Memory express (NVMe) interfaces.

The auxiliary power supply 4230 may be coupled to the host 4100 through the power connector 4002. The auxiliary power supply 4230 may be charged with the power supplied from the host 4100. The auxiliary power supply 4230 may supply power to the SSD 4200 when the power is not smoothly supplied from the host 4100. In an embodiment, the auxiliary power supply 4230 may be disposed within or external to the SSD 4200. For example, the auxiliary power supply 4230 may be disposed on a main board and may supply auxiliary power to the SSD 4200.

The buffer memory 4240 may operate as buffer memory of the SSD 4200. For example, the buffer memory 4240 may temporarily store data received from the host 4100 or data received from the plurality of flash memory 4221 to 422n, or may temporarily store metadata (e.g., mapping tables) of the plurality of flash memory 4221 to 422n. The buffer memory 4240 may include volatile memory such as Dynamic Random Access Memory (DRAM), Synchronous Dynamic Random Access Memory (SDRAM), Double Data Rate (DDR) SDRAM, Low Power DDR (LPDDR) SDRAM, and Graphics Random Access Memory (GRAM) or nonvolatile memory such as Ferroelectric Random Access Memory (FRAM), Resistive Random Access Memory (ReRAM), Spin-Transfer Torque Magnetic RAM (STT-MRAM), and Phase-change RAM (PRAM).

Figure 11:
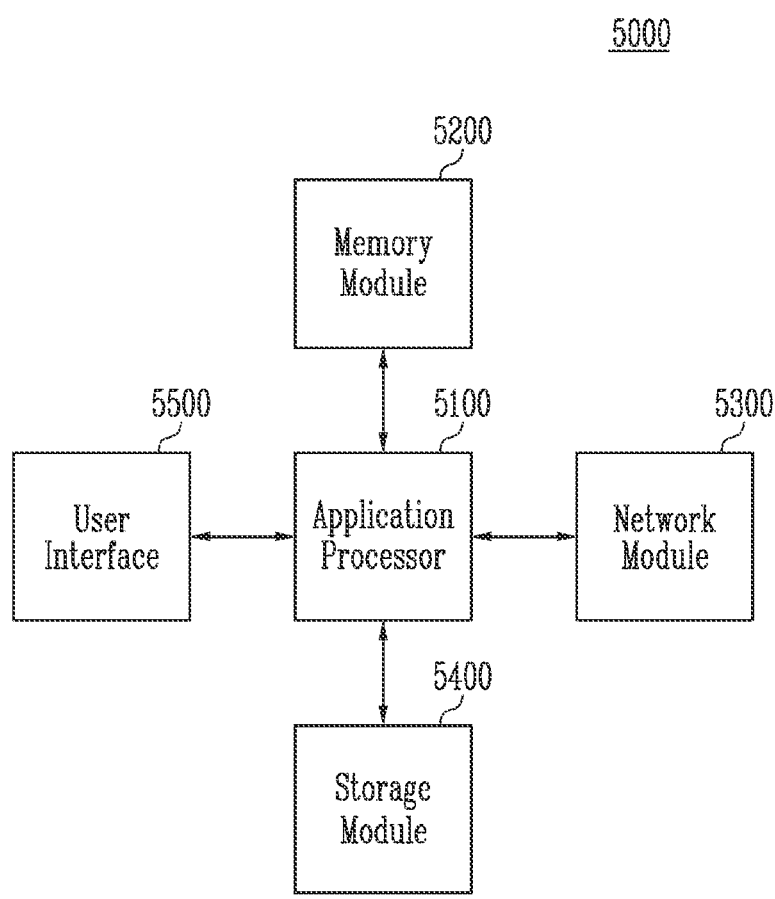
FIG. 11 is a diagram illustrating a user system according to an embodiment of the present disclosure.

FIG. 11 is a diagram illustrating a user system 5000 according to an embodiment of the present disclosure.

Referring to FIG. 11, the user system 5000 may include an application processor 5100, a memory module 5200, a network module 5300, a storage module 5400, and a user interface 5500.

The application processor 5100 may run components included in the user system 5000, an operating system (OS), or a user program. For example, the application processor 5100 may include controllers, interfaces, graphic engines, and the like, for controlling the components included in the user system 5000. The application processor 5100 may be provided as a System-on-Chip (SoC).

The memory module 5200 may function as main memory, operating memory, buffer memory, or cache memory of the user system 5000. The memory module 5200 may include volatile random access memory such as Dynamic Random Access Memory (DRAM), Synchronous DRAM (SDRAM), Double Data Rate (DDR) SDRAM, Double Data Rate 2 (DDR2) SDRAM, Double Data Rate 3 (DDR3) SDRAM, Low Power DDR (LPDDR) SDRAM, LPDDR2 SDRAM, and LPDDR3 SDRAM or nonvolatile random access memory such as Phase-Change Random Access Memory (PRAM), Resistive RAM (ReRAM), Magnetoresistive RAM (MRAM), and Ferroelectric RAM (FRAM), For example, the application processor 5100 and the memory rnodule 5200 may be packaged based on Package-on-Package (POP) and may then be provided as a single semiconductor package.

The network module 5300 may communicate with extern& devices. For example, the network module 5300 may support wireless communication, such as Code Division Multiple Access (CDMA), Global System for Mobile communication (GSM), Wideband CDMA (WCDMA), CDMA-2000, Time Division Multiple Access (TDMA), Long Term Evolution (LTE), WiMAX, Wireless LAN (MI-LAN), Ultra-WideBand (UWB), Bluetooth, and Wi-Fi communications. For example, the network module 5300 may be included in the application processor 5100.

The storage module 5400 may store data. For example, the storage module 5400 may store data received from the application processor 5100. Alternatively, the storage module 5400 may transmit the data stored in the storage module 5400 to the application processor 5100. For example, the storage module 5400 may be embodied as a nonvolatile semiconductor memory element, such as Phase-change RAM (PRAM), Magnetic RAM (MRAM), Resistive RAM (RRAM), NAND flash memory, NOR flash memory, or NAND flash memory having a three-dimensional (3D) structure. For example, the storage module 5400 may be provided as a removable storage medium (i.e., a removable drive), such as a memory card or an external drive of the user system 5000.

For example, the storage module 5400 may include a plurality of nonvolatile memory devices, and the plurality of nonvolatile memory devices may be operated in the same manner as the memory device 100 described above with reference to FIG. 1. The storage module 5400 may operate in the same manner as the storage device 1000 described above with reference to FIG.

The user interface 5500 may include interfaces which input data or commands to the application processor 5100 or output data to an external device. For example, the user interface 5500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 5500 may further include user output interfaces such as a Liquid Crystal Display (LCD), an Organic Light Emitting Diode (OLED) display device, an Active Matrix OLED (AMOLED) display device, an LED, a speaker, and a monitor.

According to embodiments of the present disclosure, an auxiliary power supply that supports an improved charging method, and a method of operating the auxiliary power supply may be provided.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of this disclosure and the following claims. Furthermore, the embodiments may be combined to form additional embodiments.

What is claimed is:
1. An auxiliary power supply, comprising:
an auxiliary power storage configured to store power that is input to the auxiliary power supply; and
a control circuit configured to:
determine a peak current level of the auxiliary power storage as a main level;
charge, for a reference time amount after the power is input to the auxiliary power supply, the auxiliary power storage by a first current source having the main level;
determine, after the reference time amount, that the auxiliary power supply is in a slow charging state when a voltage level that is charged to the auxiliary power storage by the first current source for the reference time amount is lower than a reference voltage level;

change, in response to determining that the auxiliary power supply is in the slow charging state, the peak current level from the main level to a backup level that is greater than the main level; and charge the auxiliary power storage by a second current source having the backup level.

2. The auxiliary power supply of claim 1, wherein the control circuit changes, in response to determining that the auxiliary power supply is in the slow charging state, the peak current level from the main level to the backup level when a charge limit time amount elapses after the power is input to the auxiliary power supply.

3. The auxiliary power supply of claim 1, wherein the auxiliary power storage includes a polymer capacitor.

4. The auxiliary power supply of claim 1, wherein the control circuit is further configured to change, when the voltage level that is charged to the auxiliary power storage by the second current source reaches a target voltage level, the peak current level from the backup level to the main level.

5. The auxiliary power supply of claim 1, wherein the control circuit is further configured to:
periodically generate a switching signal that operates a switching element, and
reduce, in response to determining that the auxiliary power supply is in the slow charging state, a period of the generating of the switching signal.

6. The auxiliary power supply of claim 1, wherein the control circuit includes a voltage monitoring component configured to:
monitor the voltage level that is charged to the auxiliary power storage by the first current source for the reference time amount, and
compare the voltage level that is charged to the auxiliary power storage by the first current source for the reference time amount with the reference voltage level.

7. The auxiliary power supply of claim 1, wherein the control circuit includes a counter that calculates the reference time amount.

8. A method of operating an auxiliary power supply, the method comprising:
inputting power to the auxiliary power supply;
determine a peak current level of the auxiliary power storage included the auxiliary power supply in as a main level;
charging, for a reference time amount after the power is input to the auxiliary power supply, the auxiliary power supply by a first current source having the main level;
determining, after the reference time amount, that the auxiliary power supply is in a slow charging state when a voltage level that is charged to the auxiliary power supply by the first current source for the reference time amount is lower than a reference voltage level;
changing, in response to determining that the auxiliary power supply is in the slow charging state, the peak current level from the main level to a backup level that is greater than the main level; and
charging the auxiliary power supply by a second current source having the backup level.

9. The method of claim 8, wherein the auxiliary power storage includes a polymer capacitor.

10. The method of claim 8, further comprising changing, when the voltage level that is charged to the auxiliary power supply by the second current source reaches the target voltage level, the peak current level from the backup level to the main level.

11. The method of claim 8, further comprising:
periodically generating a switching signal that operates a switching element; and
reducing a period of the generating the switching signal in response to determining that the auxiliary power supply is in the slow charging state.

12. The method of claim 8, further comprising monitoring the voltage level that is charged to the auxiliary power supply by the first current source for the reference time amount to compare the voltage level that is charged to the auxiliary power supply by the first current source for the reference time amount with the reference voltage level.

13. A storage device, comprising:
a memory device including a plurality of memory blocks for storing data;
a memory controller configured to control the memory device; and
an auxiliary power supply including:
an auxiliary power storage configured to store auxiliary power that can be supplied in case supply of power to the memory device and the memory controller is abruptly stopped; and
a control circuit configured to:
determine a peak current level of the auxiliary power storage as a main level;
charge, for a reference time amount after the power is input to the auxiliary power supply, the auxiliary power storage by a first current source having the main level;
determine, after the reference time amount, that the auxiliary power supply is in a slow charging state when a voltage level that is charged to the auxiliary power storage by the first current source for the reference time amount is lower than a reference voltage level;
change, in response to determining that the auxiliary power supply is in the slow charging state, the peak current level from the main level to a backup level that is greater than the main level; and
charge the auxiliary power storage by a second current source having the backup level.

14. The storage device of claim 13, wherein the control circuit changes, in response to determining that the auxiliary power supply is in the slow charging state, the peak current level from the main level to the backup level when a charge limit time amount elapses after the power is input to the auxiliary power supply.

15. The storage device of claim 13, wherein the auxiliary power storage includes a polymer capacitor.

16. The storage device of claim 13, wherein the control circuit is further configured to change, when the voltage level that is charged to the auxiliary power storage by the second current source reaches a target voltage level, the peak current level from the backup level to the main level.

17. The storage device of claim 13, wherein the control circuit is further configured to:
periodically generate a switching signal that operates a switching element, and
reduce, in response to determining that the auxiliary power supply is in the slow charging state, a period of the generating the switching signal.

18. The storage device of claim 13, wherein the control circuit includes a voltage monitoring component configured to:

monitor the voltage level that is charged to the auxiliary power storage by the first current source for the reference time amount, and compare the voltage level that is charged to the auxiliary power storage by the first current source for the reference time amount with the reference voltage level.

19. The storage device of claim 13, wherein the control circuit includes a counter that calculates the reference time amount.

* * * * *